US006456124B1

United States Patent
Lee et al.

(10) Patent No.: US 6,456,124 B1
(45) Date of Patent: Sep. 24, 2002

(54) METHOD AND APPARATUS FOR CONTROLLING IMPEDANCE OF AN OFF-CHIP DRIVER CIRCUIT

(75) Inventors: Jin-Ho Lee, Seoul; Uk-Rae Cho, Kyungki-do, both of (KR)

(73) Assignee: Samsung Electronics Co., Ltd., Hwasung (KR)

( * ) Notice: Subject to any disclaimer, the term of this patent is extended or adjusted under 35 U.S.C. 154(b) by 48 days.

(21) Appl. No.: 09/635,294

(22) Filed: Aug. 9, 2000

(30) Foreign Application Priority Data

Aug. 9, 1999 (KR) .............................. 99-32546

(51) Int. Cl.[7] .............................................. H03K 3/00
(52) U.S. Cl. ..................... 327/108; 327/112; 326/30; 326/82; 326/83
(58) Field of Search ................... 327/108, 112, 327/538, 543; 326/30, 26, 27, 82, 83, 86, 87, 89, 90, 91

(56) References Cited

U.S. PATENT DOCUMENTS

| 5,592,104 A | * | 1/1997 | Bach ............................ 326/27 |
| 5,638,007 A | * | 6/1997 | Sabin ........................... 326/27 |
| 5,703,496 A | * | 12/1997 | Sabin ........................... 326/27 |
| 5,869,984 A | * | 2/1999 | Eto .............................. 326/86 |
| 6,163,177 A | * | 12/2000 | Hara et al. ................... 327/108 |

* cited by examiner

Primary Examiner—Tuan T. Lam
(74) Attorney, Agent, or Firm—Marger Jonnson & McCollom, P.C.

(57) ABSTRACT

A variable impedance control circuit for a semiconductor device reduces susceptibility to power supply variations and improves impedance matching by utilizing the same power supply for portions of the array driver and for the transistor arrays used for impedance matching.

18 Claims, 3 Drawing Sheets

METHOD AND APPARATUS FOR CONTROLLING IMPEDANCE OF AN OFF-CHIP DRIVER CIRCUIT

This application claims priority from Korean patent application 99-32546 filed Aug. 9, 1999 in the name of Samsung Electronics Co., Ltd., which is herein incorporated by reference.

BACKGROUND OF THE INVENTION

Semiconductor devices utilize output circuits called off-chip driver circuits for transmitting signals from the semiconductor device to other devices though transmission lines such as those formed on printed circuit boards. An example of an off-chip driver circuit is disclosed in U.S. Pat. No. 5,440,258. For optimum performance, the output impedance of the off-chip driver should be matched to the impedance of the transmission line. Therefore, semiconductor devices often utilize variable impedance control circuits to control the impedance of off-chip driver circuits. A variable impedance control circuit typically utilizes an extra pin to adjust or "trim" the impedance of the off-chip driver circuit.

For example, in a semiconductor device having a high speed transceiver logic (HSTL) interface, a variable impedance control circuit senses the value of a resistor connected to the extra pin and trims the impedance of an off-chip driver circuit responsive to the value of the resistor. In such a semiconductor device, the main power supply voltage VDD is typically applied to the main circuitry of the device (e.g., a memory cell array) while a reduced power supply voltage VDDQ is applied to the output circuitry.

However, because the supply voltage VDD is used as the operational voltage for driving the variable impedance control circuit and the off-chip driver circuit, the impedance control circuit and the off-chip driver circuit are susceptible to changes in the level of the supply voltage VDD, thereby causing impedance mismatches.

SUMMARY OF THE INVENTION

One aspect of the present invention is a variable impedance control circuit comprising: an impedance matching transistor array operated by a first supply voltage; and an array driver coupled to the impedance matching transistor array, wherein the array driver includes one or more first internal elements operated by the first supply voltage and one or more second internal elements operated by a second supply voltage.

Another aspect of the present invention is a semiconductor device comprising: an off-chip driver circuit having a transistor array operated by a first supply voltage; and an output buffer having an array driver coupled to the transistor array, wherein the array driver includes one or more first internal elements operated by the first supply voltage and one or more second internal elements operated by a second supply voltage.

An additional aspect of the present invention is a variable impedance control circuit comprising: an off-chip driver having first and second transistor arrays; an array driver coupled to the off-chip driver and adapted to drive the first and second transistor arrays responsive to control code data; and a control code data generator coupled to the array driver and adapted to generate the control code data, wherein the control code data generator is operated from a first supply voltage; wherein the array driver includes drive elements coupled to the first and second transistor arrays, and the drive elements and the first and second transistor arrays are operated from a second supply voltage.

DETAILED DESCRIPTION

Figure 1:
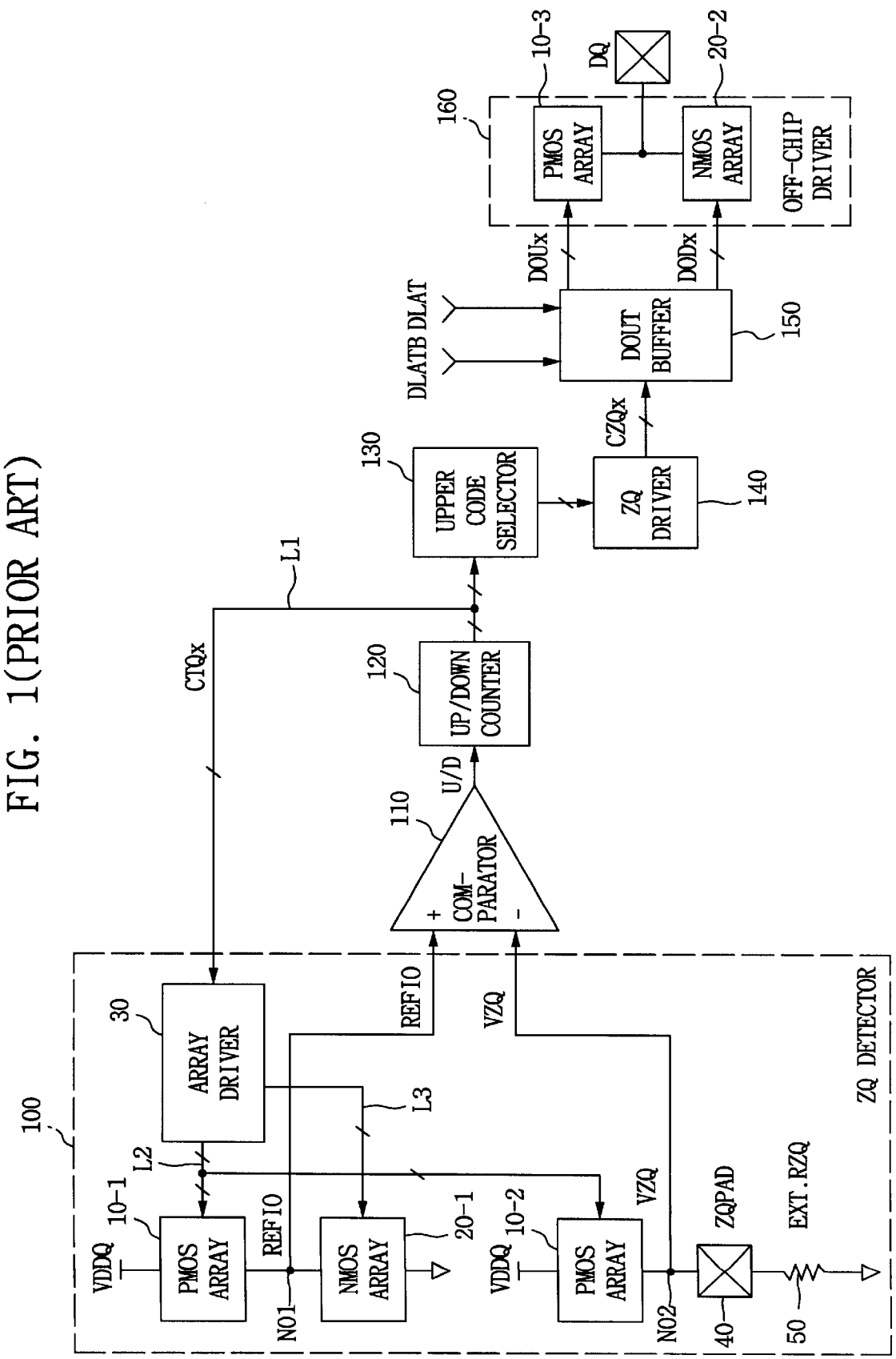
FIG. 1 is a block diagram of a prior art variable impedance control circuit and off-chip driver circuit.

FIG. 1 is a block diagram of a prior art variable impedance control circuit and off-chip driver circuit. The variable impedance control circuit includes a ZQ detecting unit 100, a comparator 110, an up/down counter 120, an upper code selector 130, and a ZQ driver 140. The off-chip driver circuit includes a DOUT buffer 150 having an array driver (not shown) and an off-chip driver 160.

A general procedure for trimming the output impedance of the off-chip driver circuit of FIG. 1 will now be described. For an HSTL interface, an extra pin is utilized for trimming the desired value of the output impedance within the range of about 35 to 70 ohms ($\Omega$). An external resistor 50 having resistance value RZQ, which is 5 times greater than the desired output impedance value, is connected to the extra pad ZQPAD 40. P channel and N channel MOS transistor arrays 10-1 and 20-1 preset the reference voltage REF10 of node NO1 to half of the output supply voltage (VDDQ/2). The comparator 110 compares the reference voltage REF10 of the node NO1 to the pad voltage VZQ of the node NO2 and outputs an up/down signal U/D in response to the comparison. The up/down counter 120 increases or decreases the control code data CTQx in response to up/down signal U/D. The array driver 30 generates drive signals L2 and L3 which selectively drive the NMOS and PMOS transistors in arrays 10-1, 20-1, and 10-2 responsive to the control code data CTQx so as to equalize the reference voltage REF10 with the pad voltage VZQ at pad 40.

When the reference voltage REF 10 and the PAD voltage VZQ are equalized at VDDQ/2, the turn-on resistance of the PMOS array 10-2 is equalized with the resistance RZQ of the external resistor 50. As the PMOS transistors of the PMOS array 10-1 and the NMOS transistors of the NMOS array 20-1 are turned on, corresponding transistors in the arrays 10-3 and 20-2 in the off-chip driver 160 are turned on through the upper code selector 130, the ZQ driver 140 and the DOUT buffer 150 so as to match the output impedance. As many transistors of the PMOS array 10-3 and NMOS array 20-2 in the off-chip driver 160 are turned on as those of the PMOS array 10-1 and NMOS array 20-1 in the ZQ detecting unit are turned. This is because the PMOS arrays 10-1 and 10-3 are constructed with the same internal structure, and the NMOS arrays 20-1 and 20-2 are constructed with the same internal structure.

When impedance matching is achieved, the upper code selector 130 selects an upper portion of the control code data CTQx. When the off-chip driver 160 is in its high impedance state, the ZQ driver 140 generates impedance control code data CZQX in response to the selected control code data CTQx and outputs it to the DOUT buffer 150. Thus, the previous impedance control code data CZQx is refreshed. The refreshed impedance control code data CZQx enables the DOUT buffer 150 responsive to the control code data. The comparator 110, up/down counter 120, upper code selector 130, and ZQ driver 140 are collectively referred to as a control code data generator.

The DOUT buffer 150 receives memory cell data DLAT, DLATB and generates the pull-up output data DOUx and pull-down output data DODx, which are output to the off-chip driver 160 to turn on the relevant transistors of the PMOS and NMOS arrays 10-3, 20-2. Therefore, final output data is supplied through the output pad DQ from the transistors selected in the off-chip driver 160. Thus, the output data signal DQ is driven by the off-chip driver 160 which has a variable output impedance that is matched to the transmission line responsive to the value of the external resistor 50.

Ideally, this causes the output data to be transmitted without distortion. However, because the operational voltage of the array driver 30 of the ZQ detecting unit and the array driver (not shown) of the DOUT buffer 150 is different from that for the PMOS arrays 10-1, 10-2, 10-3 and NMOS arrays 20-1, 20-2, it is difficult to accurately control the output impedance. This will be explained in more detail with reference to FIG. 2.

Figure 2:
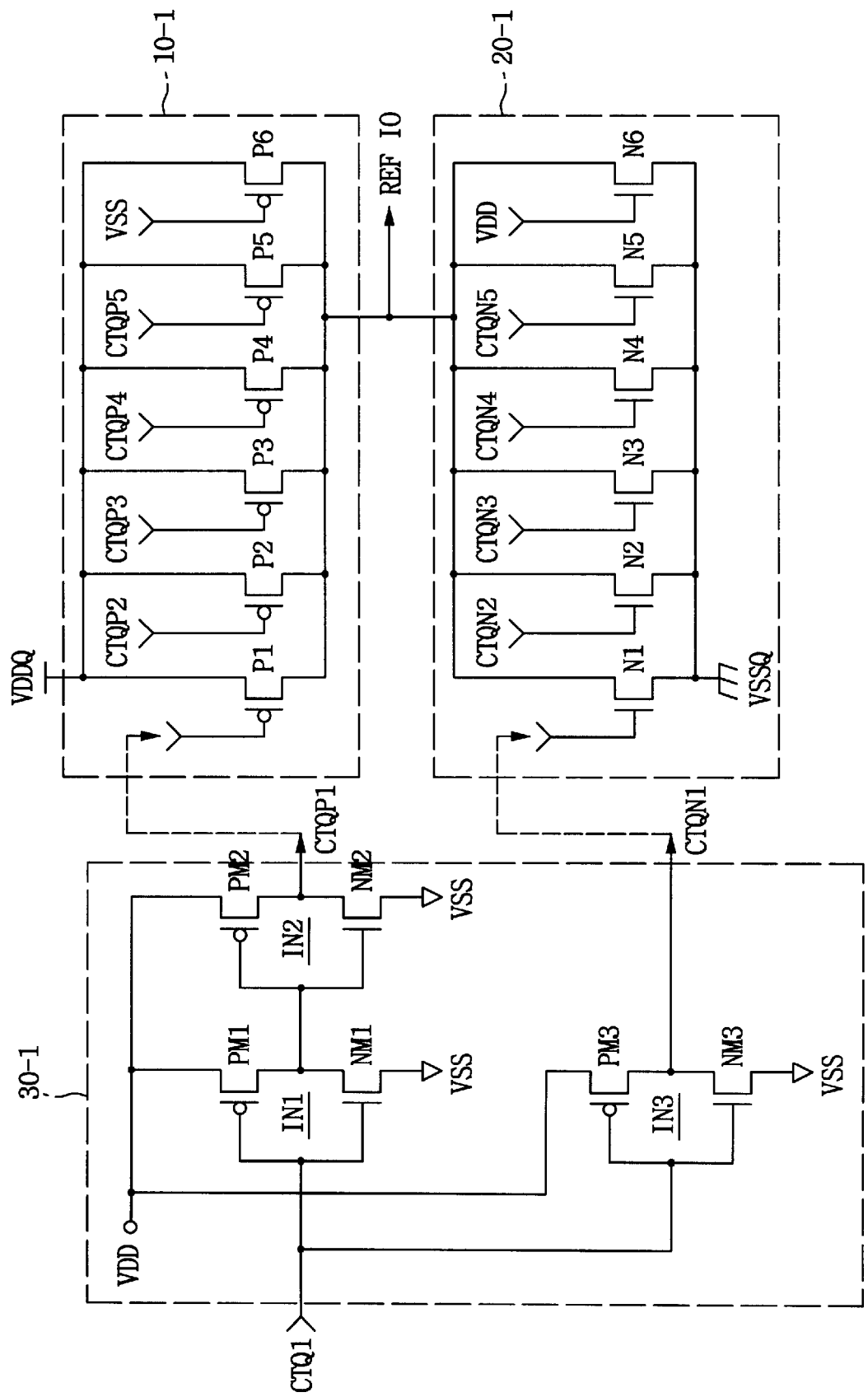
FIG. 2 is a schematic diagram showing details of some of the components of FIG. 1.

FIG. 2 is a schematic diagram showing details of an array driving unit 30-1, which is part of the array driver 30 of FIG. 1, and also showing more details of the transistor arrays 10-1 and 20-1 of FIG. 1. Referring to FIG. 2, one array driving unit 30-1 of the array driver 30 is constructed with three CMOS inverters IN1, IN2, IN3 where the supply voltage VDD is used as the operational voltage. The three CMOS inverters IN1, IN2, IN3 are each constructed from a P channel MOS field effect transistor (PMOSFET) and an N channel MOS field effect transistor (NMOSFET). The input signal to the inverters IN1, IN3 is a control code data signal CTQ1, which is one of control code data signals CTQx. The inverters IN2, IN3 output the PMOS driving control signal CTQP1 and the NMOS driving control signal CTQN1, respectively, which are further transmitted to the gate terminal of PMOS transistor P1 of the PMOS array 10-1 and the gate terminal of NMOS transistor N1 of the NMOS array 20-1, respectively. The inverters IN2 and IN3, and any other logic elements that might be used in their place, are referred to as drive elements because they drive the transistors in the transistor arrays.

However, in FIG. 2, the sources of the plurality of PMOS transistors P1, P2, . . . , P6 in the PMOS array 10-1 are commonly connected to the second supply voltage, that is, the output supply voltage terminal VDDQ (about 1.5 volt), and the drains of the transistors are commonly connected to the reference voltage terminal REF10. The gates of P1, P2, . . . , P6 have different lengths. PMOS driving control signals CTQP1, CTQP2, . . . , CTQP6 are applied to the gates of the corresponding PMOS transistors P1, P2, . . . , P6. Only a single one of the array driving units 30-1 is shown in FIG. 2, but the PMOS driving control signals CTQP2, CTQP3, . . . , CTQP6 are transmitted from other identically constructed array drivers 30-1.

Similarly, the NMOS array 20-1 is constructed with a plurality of NMOS transistors N1, N2, . . . , N6 having their sources commonly connected to the second grounding voltage, that is, the output supply voltage terminal VSSQ, and their drains commonly connected to the reference voltage terminal REF10. Again, the gates of N1, N2, . . . , N6 have different lengths.

NMOS driving control signals CTQP1, CTQP2, . . . , CTQP6 are applied to the gates of the corresponding NMOS transistors N1, N2, . . . , N6. The NMOS driving control signals CTQN2, CTQN2, . . . , CTQN6 are relevantly transmitted from other array drivers which are identical to the array driver 30-1. In FIG. 1, the PMOS arrays 10-2, 10-3 and the NMOS array 20-2 have the same structure as the PMOS array 10-1 and the NMOS array 20-1 illustrated in FIG. 2.

As shown in FIG. 2, the first supply voltage VDD (about 3.3 volts or 2.5 volts) is used as the operational voltage for the three CMOS inverters IN1, IN2, IN3 of the array driver 30-1 of the ZQ detecting unit 30, while the second supply voltage VDDQ (about 1.5 volts) is used as the operational voltage for the PMOS transistors P1, P2, . . . , P6 of the PMOS array 10-1. In addition, the first supply voltage VDD (about 3.3 volts or 2.5 volts) is used as the operational voltage for the array driver (not shown) of the DOUT buffer 150, while the second supply voltage VDDQ (about 1.5 volt) is used as the operational voltage for the PMOS arrays 10-2, 10-3. Therefore, the absolute value of the voltages Vgsp1, 2, . . . , 6 between the gates and sources of PMOS transistors P1, P2, . . . , P6 equals the second supply voltage VDDQ at the maximum, while the absolute value of voltages Vgsn1, 2, . . . , 6 between the gates and sources of the NMOS transistors N1, N2, . . . , N6 equals the first supply voltage VDD at the maximum. Therefore, if there is any change in the first supply voltage VDD, there may also be a change in the voltage between the gates and sources of the NMOS transistors N1, N2, . . . , N6 and a further change in the level of the reference voltage terminal. In other words, changes can occur in the level of the pad voltage VZQ in FIG. 1, so that the turn-on resistance of the PMOS array 10-2 differs from the resistance of the external resistor 50. Thus, changes in the supply voltage VDD result in impedance mismatches, thereby causing distortion and transmission errors in the output signals.

As described above, impedance mismatching has frequently occurred in the prior art because the impedance control circuit and off-chip driver are directly influenced by changes in the supply voltage VDD. Therefore, in order to solve the major problem in the prior art, an embodiment of the present invention is presented in FIG. 3.

Figure 3:
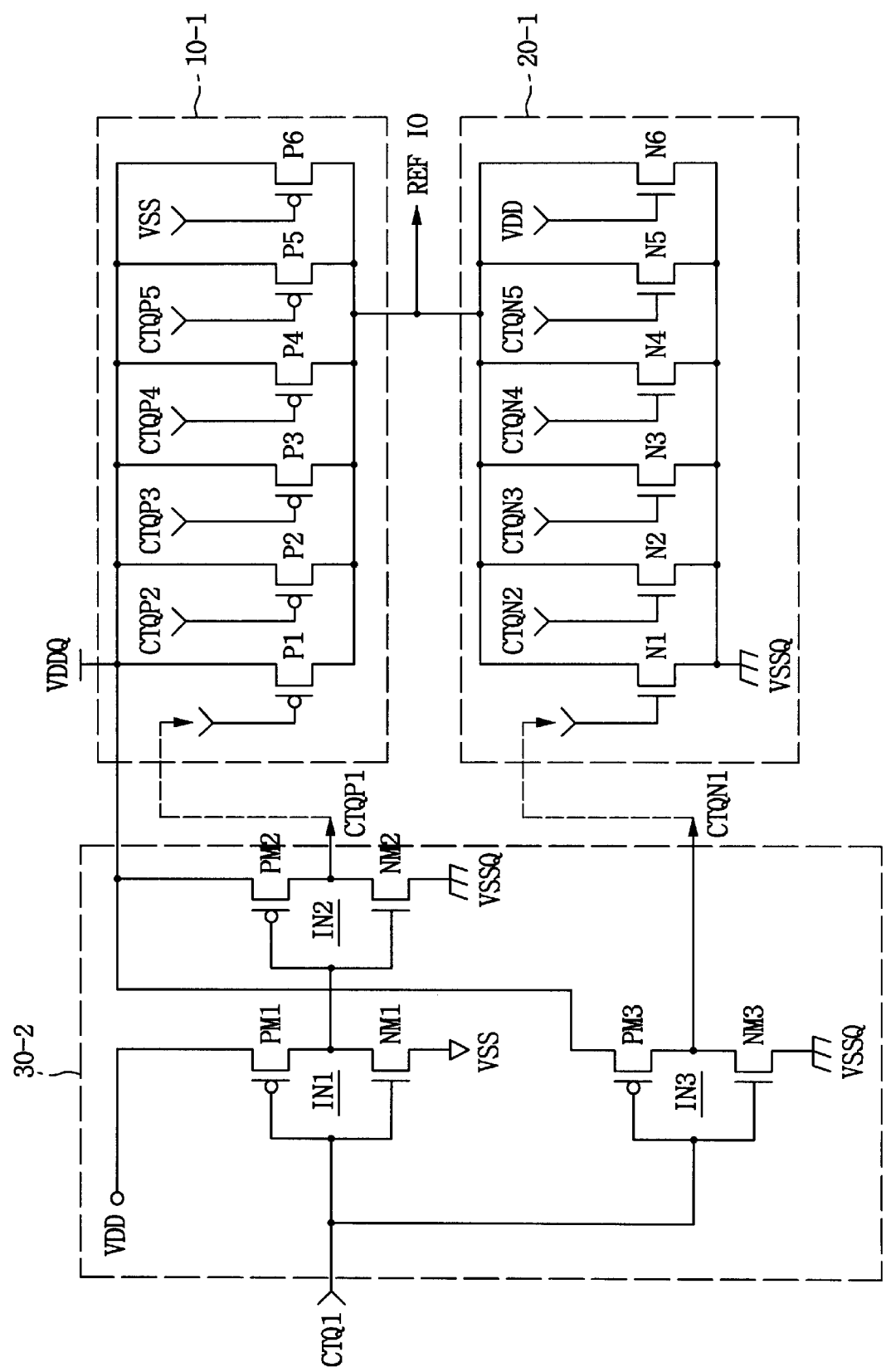
FIG. 3 is a schematic diagram of an embodiment of an array driving unit and transistor arrays in accordance with the present invention.

FIG. 3 is a schematic diagram of an embodiment of an array driving unit 30-2 and transistor arrays 10-1 and 20-1 of a ZQ detector constructed in accordance with the present invention. As shown in FIG. 3, the internal terminals of the circuit are constructed in the same manners as those shown in FIG. 2. However, the second supply voltage VDDQ is used as the operational voltage for inverters IN2, IN3 of array driving unit 30-2. Similarly, array driving units in an array driver (not shown) in a DOUT buffer of a semiconductor device in accordance with the present invention also includes internal elements which are separately operated from the first and second supply voltages. The transistor arrays 10-1, 10-2, 10-3 are constructed with internal elements operated by the second supply voltage.

An advantage of the present invention is that it can be implemented without requiring any additional circuit elements.

In FIG. 3, the second supply voltage VDDQ becomes the absolute value of the voltage Vgsp1, 2, . . . , 6 between the gates and sources of the PMOS transistors P1, P2, . . . , P6, respectively at the maximum. VDDQ also becomes the absolute value of the voltage Vgsn1, 2, . . . , 6 between the gates and sources of the NMOS transistors N1, N2, . . . , N6 at the maximum. Even if there is a change in the first supply voltage VDD, it does not influence the voltage between gates and sources of the NMOS transistors N1, N2, . . . , N6 of the array 20-1 because they are part of an independent structure which is not influenced by the first supply voltage VDD. Therefore, even if there is a change in the first supply voltage VDD, the level of the reference voltage REF 10 does not change, so there is no change in the level of the pad voltage. Thus, the turn-on resistance and the external resistance 50 remain at the same value in spite of changes in the supply voltage VDD, and impedance matching can be achieved and maintained so as to prevent or minimize any error in the transmission of output signals.

Therefore, there is an advantage in the present invention in that an impedance control circuit and an off-chip driver circuit of a semiconductor device such as a static RAM are not directly influenced by changes in supply voltage VDD, thereby minimizing or preventing impedance mismatches and stabilizing data output operations of a semiconductor memory device constructed in accordance with the present invention. Furthermore, there is another advantage in the present invention in that no additional elements are included in the circuit for impedance matching of the semiconductor device, thereby improving performance and reducing power consumption.

While the invention has been described in terms of a preferred embodiment, those skilled in the art will recognize that the invention can be practiced with modifications within the spirit and scope of the appended claims. For instance, other logic elements like AND or NAND gates can be replaced for the inverters of the array driver. The transistor arrays can be constructed with other circuit elements for the same or similar functions. We claim all modifications and variations coming within the spirit and scope of the following claims.

What is claim is:

1. A variable impedance control circuit comprising:
   an impedance matching transistor array operated by a first supply voltage and capable of outputting a variable reference voltage; and
   an array driver coupled to the impedance matching transistor array, wherein the array driver includes one or more first internal elements operated by the first supply voltage and one or more second internal elements operated by a second supply voltage.

2. A circuit according to claim 1 wherein the second supply voltage is higher than the first supply voltage.

3. A circuit according to claim 2 wherein the one or more first internal elements are CMOS inverters coupled to drive transistors in the impedance matching transistor array.

4. A circuit according to claim 1 wherein the impedance matching transistor array comprises a plurality of PMOS transistors having different gate lengths.

5. A circuit according to claim 4 further including a second impedance matching transistor array coupled to the array driver and operated by the first supply voltage, wherein the second impedance matching transistor array comprises a plurality of NMOS transistors having different gate lengths.

6. A semiconductor device comprising:
   an off-chip driver circuit having a transistor array operated by a first supply voltage and capable of outputting a variable reference voltage; and
   an output buffer having an array driver coupled to the transistor array, wherein the array driver includes one or more first internal elements operated by the first supply voltage and one or more second internal elements operated by a second supply voltage.

7. A semiconductor device according to claim 6 wherein the second supply voltage is higher than the first supply voltage.

8. A semiconductor device according to claim 6 wherein the one or more first internal elements are CMOS inverters coupled to drive transistors in the transistor array.

9. A semiconductor device according to claim 6 wherein the transistor array comprises a plurality of PMOS transistors having different gate lengths.

10. A semiconductor device according to claim 9 further including a second transistor array coupled to the array driver and operated by the first supply voltage, wherein the second transistor array comprises a plurality of NMOS transistors having different gate lengths.

11. A variable impedance control circuit comprising:
    an off-chip driver having first and second transistor arrays capable of outputting a variable reference voltage;
    an array driver coupled to the off-chip driver to drive the first and second transistor arrays responsive to control code data; and
    a control code data generator coupled to the array driver to generate the control code data, wherein the control code data generator is operated from a first supply voltage;
    wherein the array driver includes drive elements coupled to the first and second transistor arrays, and the drive elements and the first and second transistor arrays are operated from a second supply voltage.

12. A circuit according to claim 11 wherein the drive elements are inverters.

13. A variable impedance control circuit comprising:
    an off-chip driver having first and second transistor arrays capable of outputting a variable reference voltage;
    an array driver coupled to the off-chip driver and adapted to drive the first and second transistor arrays responsive to control code data; and
    a control code data generator coupled to the array driver and adapted to generate the control code data, wherein the control code data generator is operated from a first supply voltage;
    wherein the array driver includes drive elements coupled to the first and second transistor arrays, and the drive elements and the first and second transistor arrays are operated from a second supply voltage; and
    wherein the array driver further includes circuit elements operated from the first supply voltage.

14. A circuit according to claim 13 wherein the array driver comprises:
    an input terminal for receiving control code data;
    a first output terminal coupled to the first transistor array;
    a second output terminal coupled to the second transistor array;
    a first inverter operated from the first supply voltage; and
    second and third inverters operated from the second supply voltage;
    wherein the first inverter has an input terminal coupled to the input terminal of the array driver and an output terminal coupled to an input terminal of the second inverter, the second inverter has an output terminal coupled to the first output terminal of the array driver, and the third inverter has an input terminal coupled to the input terminal of the array driver and an output terminal coupled to the second output terminal of the array driver.

15. A method for operating an impedance matching circuit having a control code data generator operated from a first supply voltage, a transistor array operated from a second supply voltage and capable of outputting a variable reference voltage, and an array driver having a drive element coupled to the transistor array, the method comprising:

operating the drive element from the second supply voltage.

16. A method according to claim 15 wherein the impedance matching circuit further includes a second transistor array, the drive element is a first drive element and the array driver further includes a second drive element coupled to the second transistor array, the method further comprising:

operating the second drive element from the second supply voltage.

17. A method according to claim 16 wherein the array driver further includes an additional circuit element coupled to the first drive element, the method further comprising:

operating the additional circuit element from the first supply voltage.

18. A method according to claim 17 wherein the first and second drive elements and the additional circuit elements are inverters.

* * * * *